US011276593B2

(12) United States Patent
Cherry, III et al.

(10) Patent No.: US 11,276,593 B2
(45) Date of Patent: Mar. 15, 2022

(54) SYSTEMS AND METHODS FOR HORIZONTAL WAFER PACKAGING

(71) Applicant: Rorze Automation, Inc., Fremont, CA (US)

(72) Inventors: Royal Wallace Cherry, III, San Marcos, CA (US); Omied Surendra Lele, Cupertino, CA (US); Bernardo Gonzalez, Milpitas, CA (US); Rahul Janardhan Chalmela, San Jose, CA (US); Yinglong Li, Fremont, CA (US)

(73) Assignee: Rorze Automation, Inc., Fremont, CA (US)

( * ) Notice: Subject to any disclaimer, the term of this patent is extended or adjusted under 35 U.S.C. 154(b) by 110 days.

(21) Appl. No.: 16/936,262

(22) Filed: Jul. 22, 2020

(65) Prior Publication Data

US 2021/0028038 A1    Jan. 28, 2021

Related U.S. Application Data

(60) Provisional application No. 62/877,222, filed on Jul. 22, 2019.

(51) Int. Cl.
| | |
|---|---|
| *B25J 15/00* | (2006.01) |
| *B65G 57/00* | (2006.01) |
| *B65G 59/00* | (2006.01) |
| *H01L 21/673* | (2006.01) |
| *B65G 47/91* | (2006.01) |
| *H01L 21/683* | (2006.01) |
| *H01L 21/67* | (2006.01) |
| *B65G 59/02* | (2006.01) |
| *B65G 57/04* | (2006.01) |
| *B65G 59/04* | (2006.01) |

(52) U.S. Cl.
CPC ........ *H01L 21/67346* (2013.01); *B65G 47/91* (2013.01); *H01L 21/67259* (2013.01); *H01L 21/6838* (2013.01); *B25J 15/0052* (2013.01); *B65G 57/005* (2013.01); *B65G 57/04* (2013.01); *B65G 59/005* (2013.01); *B65G 59/02* (2013.01); *B65G 59/04* (2013.01)

(58) Field of Classification Search
None
See application file for complete search history.

(56) References Cited

U.S. PATENT DOCUMENTS

| | | | |
|---|---|---|---|
| 5,295,777 | A | 3/1994 | Hodos |
| 5,759,006 | A | 6/1998 | Miyamoto |
| 6,048,162 | A | 4/2000 | Moslehi |
| 6,183,186 | B1 | 2/2001 | Howells |

(Continued)

*Primary Examiner* — Ronald P Jarrett
(74) *Attorney, Agent, or Firm* — David R. Stevens; Stevens Law Group

(57) ABSTRACT

Systems and methods to manipulate stacks of silicon wafers and rings are described. In one aspect, a robotic actuator includes a robotic end effector that further a first surface having multiple attached wafer suction cups arranged to collectively grasp a silicon wafer. The robotic end effector also includes a second surface that further includes multiple attached ring suction cups arranged to collectively grasp a ring. The second surface also includes a bulk grabber positionable to grasp a collective stack of rings. The robotic actuator also includes an axial actuator configured to rotate the robotic end effector about a flip axis, such that either the first surface or the second surface faces vertically upwards.

20 Claims, 12 Drawing Sheets

(56) References Cited

U.S. PATENT DOCUMENTS

| | | |
|---|---|---|
| 6,283,692 B1 | 9/2001 | Perlov |
| 6,323,616 B1 | 11/2001 | Sagues |
| 6,446,806 B1 | 9/2002 | Ohori |
| 6,632,068 B2 | 10/2003 | Zinger |
| 7,648,327 B2 | 1/2010 | Bonora |
| 7,976,263 B2 | 7/2011 | Barker |
| 8,544,920 B2 | 10/2013 | Lee |
| 2002/0105236 A1 | 8/2002 | Fosnight |
| 2003/0108415 A1 | 6/2003 | Hosek |
| 2003/0173790 A1 | 9/2003 | Hartog |
| 2003/0198542 A1 | 10/2003 | Yen |
| 2003/0199173 A1 | 10/2003 | Ogawa |
| 2004/0040661 A1 | 3/2004 | Obikane |
| 2005/0008467 A1 | 1/2005 | Huang |
| 2007/0033827 A1 | 2/2007 | Kim |
| 2015/0246447 A1 | 9/2015 | Furuichi |
| 2018/0215049 A1 | 8/2018 | Bogner |
| 2018/0311832 A1 | 11/2018 | Bosboom |

SYSTEMS AND METHODS FOR HORIZONTAL WAFER PACKAGING

RELATED APPLICATIONS

This application claims the benefit of U.S. Provisional Application Ser. No. 62/877,222, filed Jul. 22, 2019 and entitled "Systems and Methods for Horizontal Wafer Packaging", which is hereby incorporated herein by reference in its entirety.

BACKGROUND

Technical Field

The present disclosure relates to systems and methods that use one or more robotic actuators to manipulate stacks of silicon wafers and rings.

Background Art

Contemporary systems performing silicon wafer handling and packaging have to work with multiple silicon wafers and rings. Oftentimes, a preferred technique of packaging silicon wafers is to stack the silicon wafers alternately with rings. An associated automated process of independently handling silicon wafers and rings, and packaging them into a transportable stack, can be a complex process. Typically, multiple robotic actuators are needed to perform the packaging process and an associated process of handling and moving the stack of alternating silicon wafers and rings. Typically, only part of this process is automated, and other parts need to be completed manually.

SUMMARY

Aspects of the invention are directed to systems and methods for handling silicon wafers, rings, and stacks comprised of silicon wafers and rings.

In one aspect, a robotic actuator includes a first surface with multiple attached wafer suction cups, and a second surface with multiple attached ring suction cups. The wafer suction cups are configured to collectively grasp a silicon wafer. The ring suction cups are configured to grasp a ring. The second surface includes a bulk grabber that is configured to grasp a collective stack of rings. The robotic actuator includes an axial actuator configured to rotate the bulk grabber about a flip axis, such that either the first surface or the second surface faces vertically upwards.

In another aspect, a robotic actuator creates a stack of silicon wafers and rings by alternately manipulating (i.e., grasping, transporting and placing) rings and silicon wafers. The robotic actuator may create the stack of silicon wafers and rings in a horizontal wafer shipper.

In another aspect, a robotic actuator unpacks a stack of silicon wafers and rings by manipulating the stack of silicon wafers and rings. The robotic actuator grasps a topmost ring from the stack and places the ring at a buffer station. The robotic actuator then determines whether a subsequent object in the stack is a silicon wafer or a ring. If the subsequent object is a ring, the robotic actuator grasps the ring and places the ring at the buffer station. If the subsequent object is a silicon wafer, a wafer handling robotic actuator, (referred to as a wafer handler robot) grasps the silicon wafer and deposits the silicon wafers at a front opening unified pod (FOUP).

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
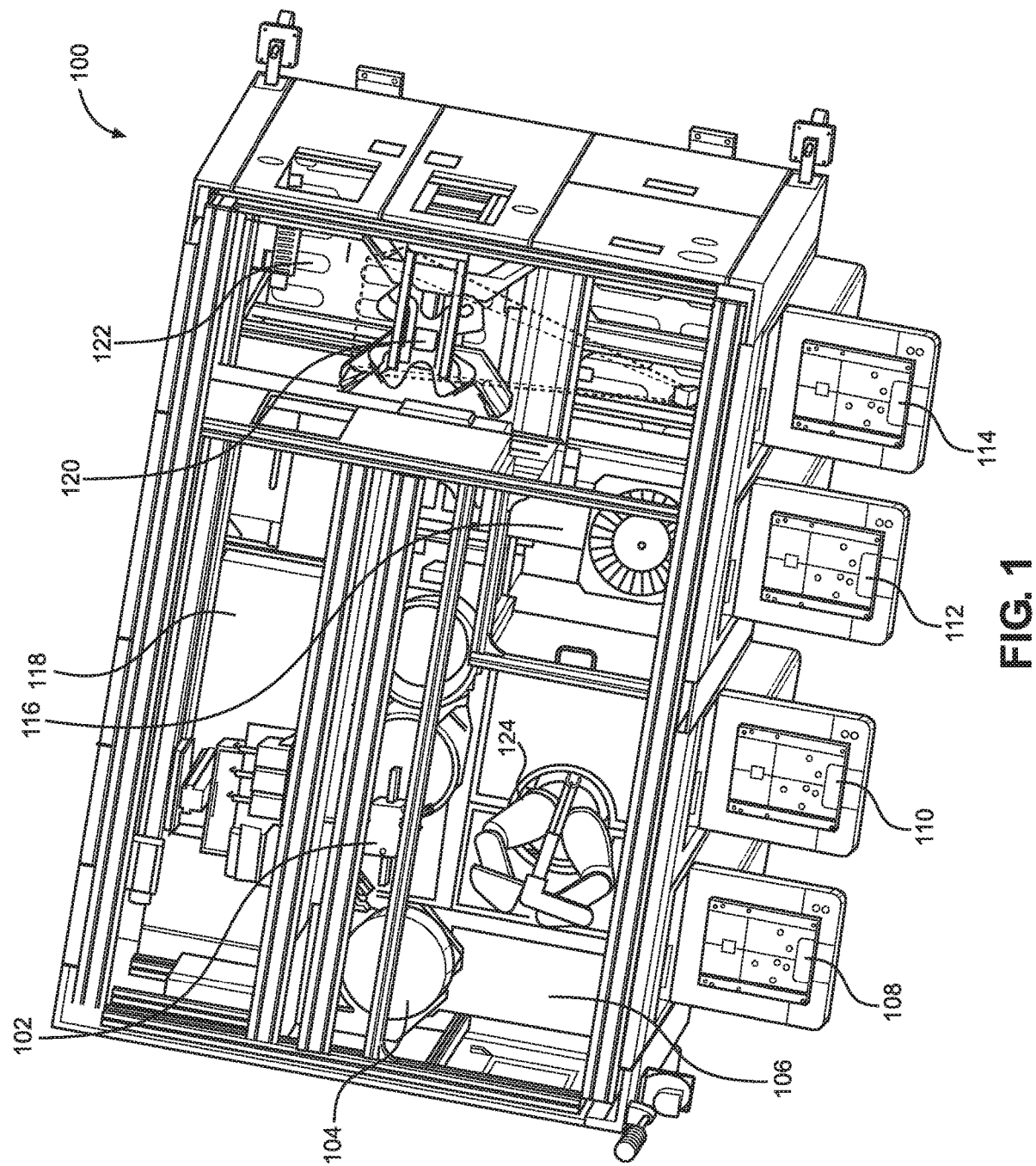
FIG. 1 is a schematic diagram depicting a horizontal wafer packaging (HWP) sorter.

In the following description, reference is made to the accompanying drawings that form a part thereof, and in which is shown by way of illustration specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

Embodiments in accordance with the present disclosure may be embodied as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random-access memory (RAM) device, a read-only memory (ROM) device, an erasable programmable read-only memory (EPROM or Flash memory) device, a portable compact disc read-only memory (CDROM), an optical storage device, a magnetic storage device, and any other storage medium now known or hereafter discovered. Computer program code for carrying out operations of the present disclosure may be written in any combination of one or more programming languages. Such code may be compiled from source code to computer-readable assembly language or machine code suitable for the device or computer on which the code will be executed.

Embodiments may also be implemented in cloud computing environments. In this description and the following claims, "cloud computing" may be defined as a model for enabling ubiquitous, convenient, on-demand network access to a shared pool of configurable computing resources (e.g., networks, servers, storage, applications, and services) that can be rapidly provisioned via virtualization and released with minimal management effort or service provider interaction and then scaled accordingly. A cloud model can be composed of various characteristics (e.g., on-demand self-service, broad network access, resource pooling, rapid elasticity, and measured service), service models (e.g., Software as a Service ("SaaS"), Platform as a Service ("PaaS"), and Infrastructure as a Service ("IaaS")), and deployment models (e.g., private cloud, community cloud, public cloud, and hybrid cloud).

The flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which includes one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks.

Contemporary techniques to transport silicon wafers can involve creating alternating stacks of silicon wafers and spacers such as rings. Handling multiple silicon wafers and spacers by a robotic actuator presents several challenges. For example, when a single silicon wafer is to be handled, adhesive forces such as vacuum forces may cause several silicon wafers to stick together. This may cause problems when an associated wafer-spacer stack is created. Also, handling a stack of multiple spacers using a robotic actuator is another operation that can be challenging to implement.

Aspects of the invention described herein are configured to perform automated handling of multiple silicon wafers and rings using a single robotic actuator and an associated robotic end effector. A method for creating a stack of alternating rings and silicon wafers alternately manipulates a ring and a silicon wafer grasped from stacks of rings and silicon wafers respectively. A method to unpack a stack of silicon wafers and rings includes grasping a ring from the stack, and sensing whether a subsequent object in the stack is a ring or a silicon wafer.

FIG. 1 is a schematic diagram depicting a horizontal wafer packaging sorter 100 (also referred to herein as "HWP sorter 100"). In an aspect, HWP sorter 100 includes a robotic end effector 102 that is configured to manipulate one or more silicon wafers and rings, as described herein. HWP sorter 100 may be configured to handle silicon wafers of a diameter of approximately 300 mm. HWP sorter 100 may also include a 300 mm aligner 104 that is configured to manipulate one silicon wafer at a time such that a set of multiple silicon wafers as placed in a stack are substantially coaxial. Essentially, 300 mm aligner 104 ensures that a stack of silicon wafers being assembled to be stacked in a cassette (also referred to as a "horizontal wafer shipper," or an "HWS") are appropriately aligned.

A clean zone 106 included in HWP sorter 100 generates and maintains a clean environment (i.e., a specified cleanliness level) to minimize a probability of contaminating a silicon wafer being handled by HWP sorter 100. A clean zone 118 and a clean zone 122 included in HWP sorter 100 each performs functions similar to clean zone 106. In an aspect, clean zone 106 and 122 are actively maintained as being cleaner than clean zone 108. In an embodiment, clean zone 122 is separated from zone 106, and maintains a clean environment at a lower cleanliness level than clean zone 106. Clean zone 118 may be separated from clean zone 122 and clean zone 106, with clean zone 118 never containing exposed silicon wafers.

In some embodiments, HWP sorter 100 includes a load port 108 and a load port 110. Each of load port 108 and load port 110 is configured to enable one or more silicon wafers loaded in a cassette to be deposited into or retrieved from HWP sorter 100. A modified load port 112 and a modified load port 114 included in some embodiments of HWP sorter 100 are each configured to enable one or more silicon wafers loaded in an HWS to be deposited or retrieved from HWP sorter 100. In some aspects, each of modified load port 112 and modified load port 114 includes a safety-rated magnetic sensor for monitoring the associated load port door status. (A standard 300 mm load port such as load port 108 or load port 110 does not use a safety-rated sensor to monitor door status.) In an aspect, HWP sorter 100 packs and unpacks wafers between the HWS and one or more front-opening unified pods (FOUPs).

In some aspects, modified load port 112 and modified load port 114 may include one or more light curtains that are configured to deactivate any operation being performed by HWP sorter 100 if a light path associated with a light curtain is interrupted while a load port door status is OPEN. This is a safety feature designed to protect a human operator from injury from moving parts associated with HWP sorter 100 while working with HWP sorter 100. Some embodiments of HWP sorter 100 include one or more moving robotic actuators and associated robotic end effectors, as described herein. In some aspects, a light curtain protects an associated user from access to a moving robot and associated moving parts, while also allowing functionality of an overhead hoist transfer (OHT) in one embodiment and an automated guided vehicle (AGV) in another embodiment.

In some aspects, HWP sorter 100 is configured to receive a stack of silicon wafers enclosed in a carrier, or HWS. In some embodiments, HWP sorter 100 receives the carrier (or an HWS) using an HWS handler 116. If stack of wafers is inside an HWS the stack of wafers may be picked up from a load port by HWS Handler 116. Otherwise, the stack of wafers may be received from either of load port 108 or 110. Details about HWS handler 116 are provided herein. Some embodiments of HWP sorter include a lid removal station 120 (also referred to as a "delidder") that is configured to remove a lid off of an HWS to allow further handling of the silicon wafers enclosed in the HWS. Details about lid removal station 120 and its associated functions are presented herein.

An HWS may contain a stack of multiple silicon wafers separated by separating rings, also referred to as "rings." To gain physical access to a silicon wafer, an associated ring has to be removed. This process is performed by robotic end effector 102. In some embodiments, robotic end effector 102 is also configured to alternately stack one or more rings with silicon wafers.

In an embodiment, HWP sorter 100 may include a wafer handler robot 124 that is configured to manipulate a silicon wafer. For example, wafer handler robot 124 may transfer a silicon wafer from 300 mm aligner 104 to robotic end effector 102.

Features of an embodiment of HWP sorter 100 include:
1) Standard 300 mm load ports, qty. 2 (108, 110),
2) Standard 300 mm Wafer Handler (wafer handler robot), qty. 1 (124),
3) Standard 300 mm Aligner, qty. 1 (104);
4) Ring Handler (robotic end effector), qty. 1 (102);
5) HWS Handler, qty. 1 (116);
6) De-lidding Station, qty. 1 (120); and
7) 300 mm load ports modified to hold HWS, qty. 2 (112, 114).

Some embodiments of HWP sorter may be configured with a fully-automated wafer-handling capability, an ability to pack or unpack greater than 200 wafers per hour (WPH), and other features as described herein.

Figure 2:
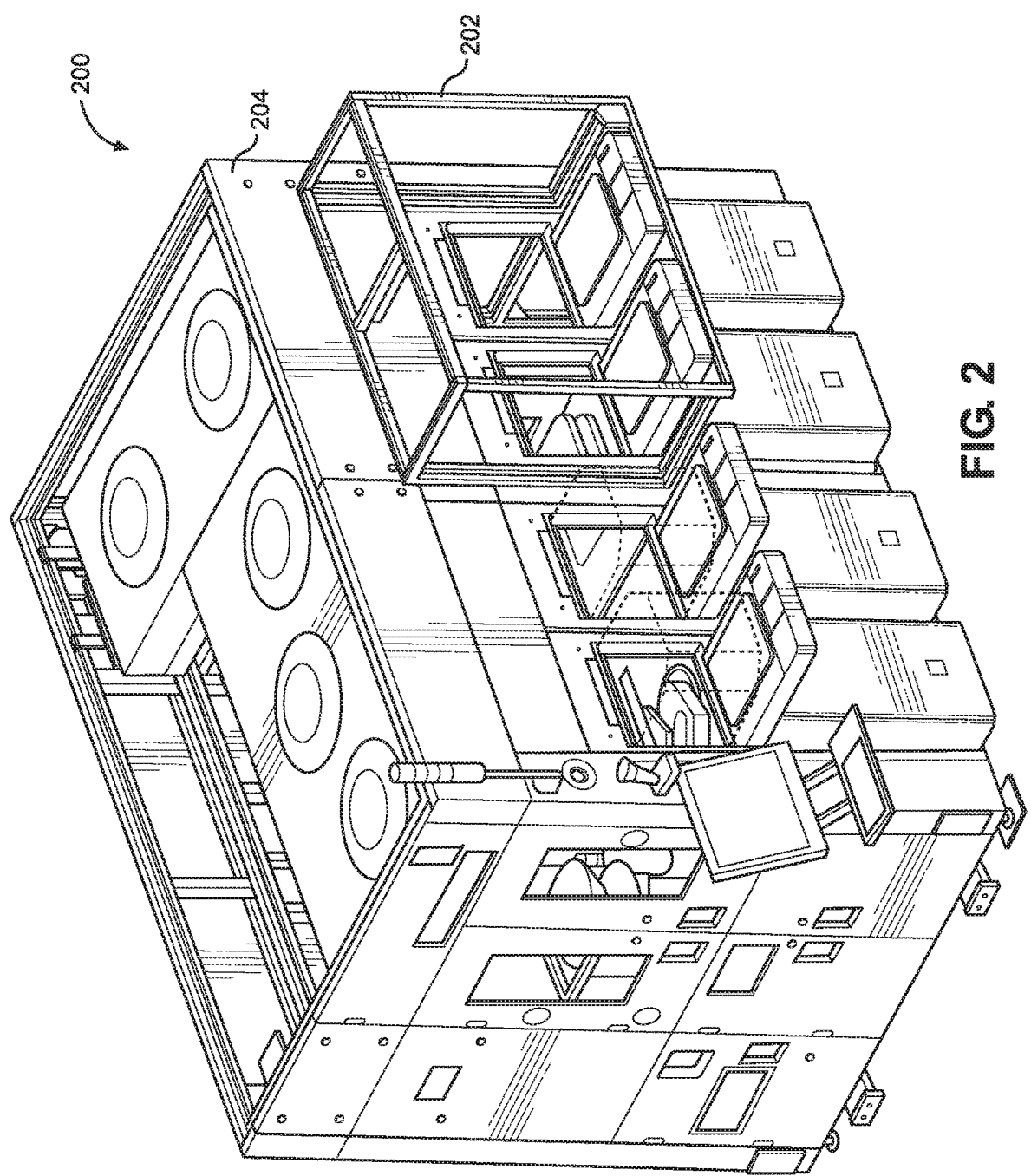
FIG. 2 is a schematic diagram depicting a view of an embodiment of an HWP sorter.

FIG. 2 is a schematic diagram depicting a view 200 of an embodiment of an HWP sorter 100. View 200 shows a light curtain 202 and a fan filter unit (FFU) 204. In aspect, light curtain 202 facilitates operation by an AGV and an OHT, while performing protection functions associated with a human operator. Specifically, any operation of HWP sorter 100 is interrupted if light curtain 202 detects an object such as a human hand in a vicinity of a load port. This is done to avoid potentially injuring a human operator due to robotic actuators.

In some embodiments, FFU 204 is comprised of a subassembly that contains fans and an ultra-low particulate air (ULPA) filter. FFU 204 may be configured to take in "dirty" air from the external atmosphere and push the air through the ULPA filter into the internals of HWP sorter 100 as clean air. In an aspect, FFU 204 to forces air inside HWP sorter 100 to create an environment that is at a higher pressure than the external environment of the HWP sorter 100. This prevents particles from the external environment from entering inside HWP sorter 100, while also creating a laminar air flow down through the system that pushes any particles to the bottom and away from the wafer handling area. FFU 204 is responsible for creating and maintaining clean conditions in clean zones 106 and 122.

Figure 3:
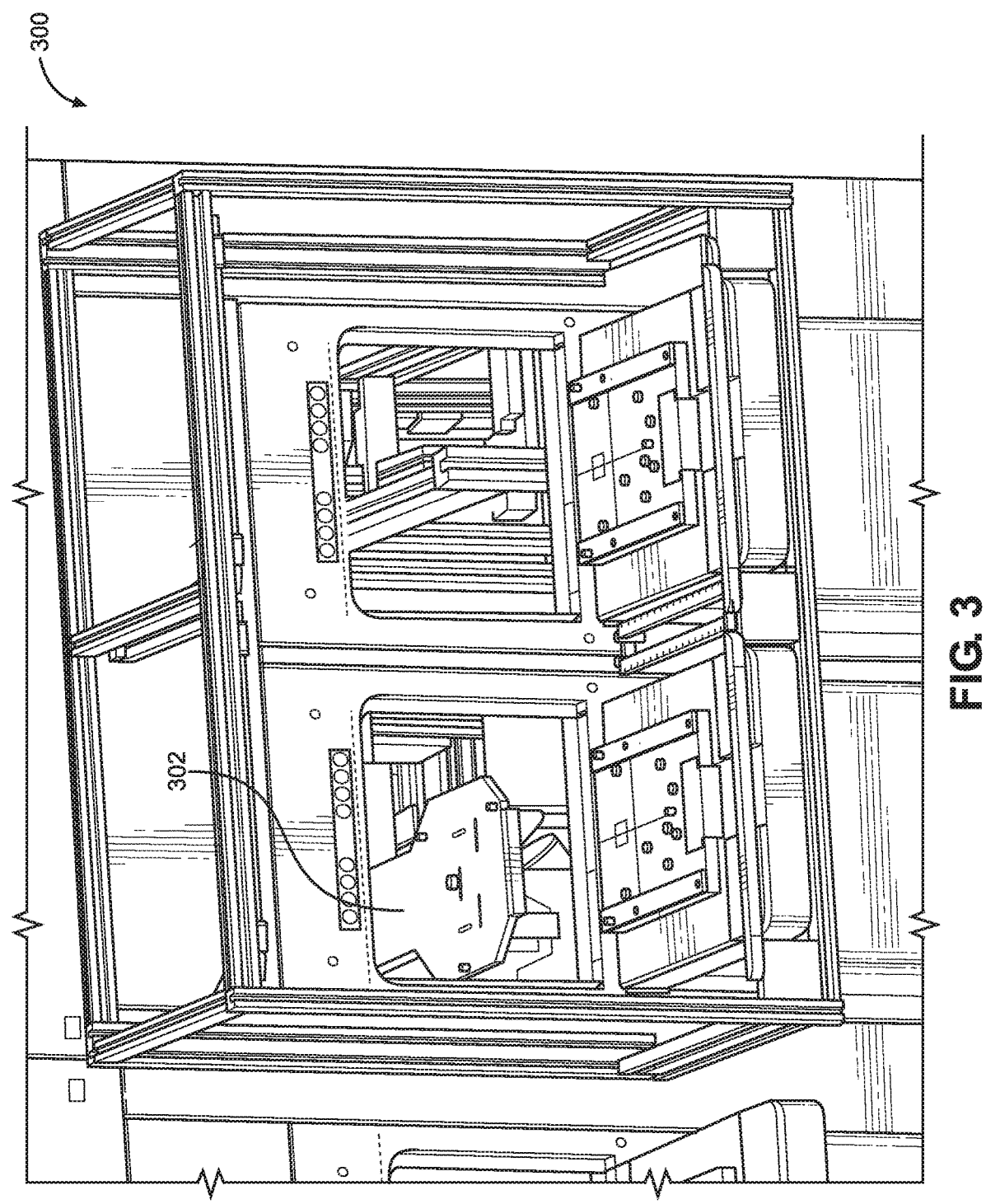
FIG. 3 is a schematic diagram depicting a view of an HWP sorter.

FIG. 3 is a schematic diagram depicting a view 300 of HWP sorter 100. View 300 depicts an HWS handler 302. In an aspect, HWS handler 302 is identical to HWS handler 116. HWS handler 302 is configured to receive a carrier or HWS, and transport the carrier or HWS within HWP sorter 100 for further processing.

Figure 4:
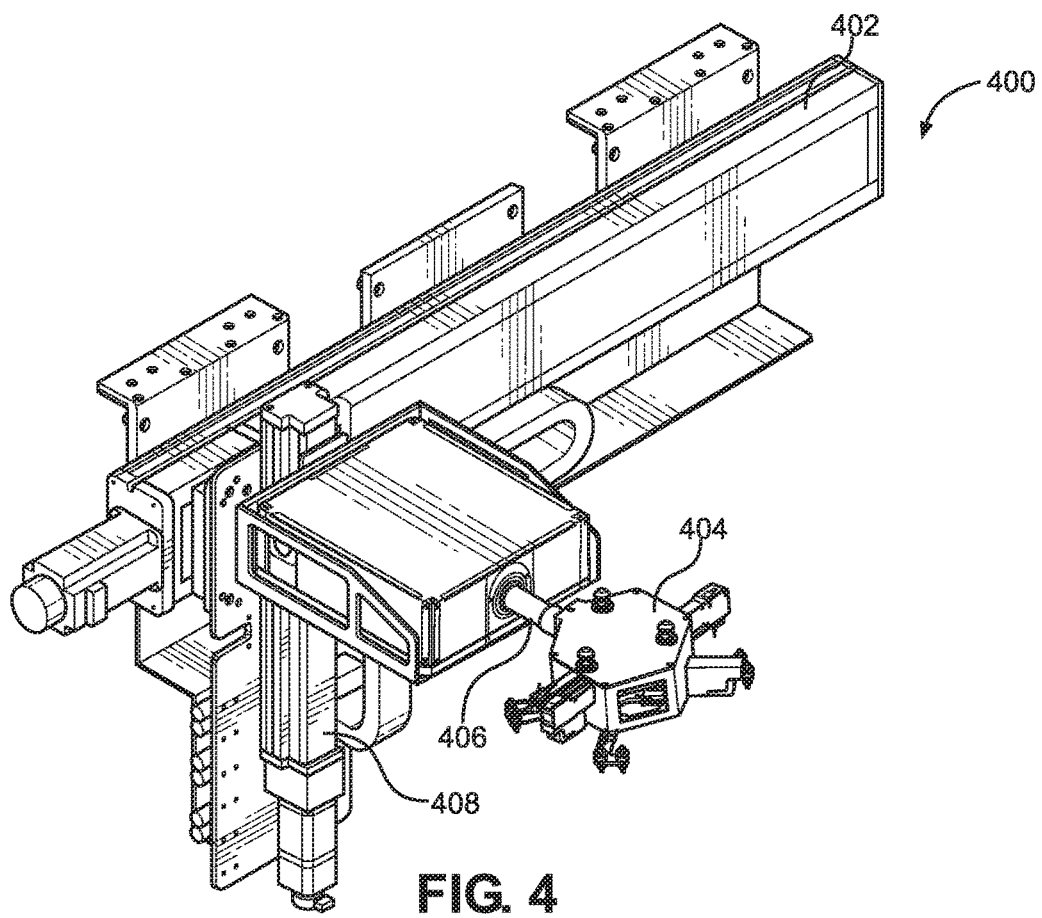
FIG. 4 is a schematic diagram depicting an embodiment of a robotic actuator.

Other features of HWP sorter 100 include:
Fully Automated operation
Greater than 200 wafers per hour (WPH) packing or unpacking
1 HWP Port (optional 2nd available)
2 Load Ports for efficient wafer processing
OHT, AGV or Manual loading compatible
Class 1 FFU environment
2 Ring handling reservoirs—one for clean rings and another for potentially dirty rings based on packing or unpacking
Sensors to confirm number of rings in carrier
RFID for carriers FIG. 4 is a schematic diagram depicting an embodiment of a robotic actuator 400. In an aspect, robotic actuator 400 includes a robotic end effector 404. Robotic end effector 404 may be identical to robotic end effector 102. Robotic end effector 404 may be enabled to pivot (i.e., perform rotational motion) about a flip axis 406. This pivoting operation and associated multiple spatial orientations associated with robotic end effector 404 further enable multiple operating modes of robotic end effector 404. In one spatial orientation, robotic end effector 404 is configured to grip (i.e., grasp) a silicon wafer. In another spatial orientation, robotic end effector 404 is configured to grip (i.e., grasp) a ring or a stack of rings. In some embodiments, robotic end effector 404 is configured to move along an X-track 402, and a Z-track 408. This represents a translational motion of robotic end effector 404 in a two-dimensional XZ plane.

Figure 5:
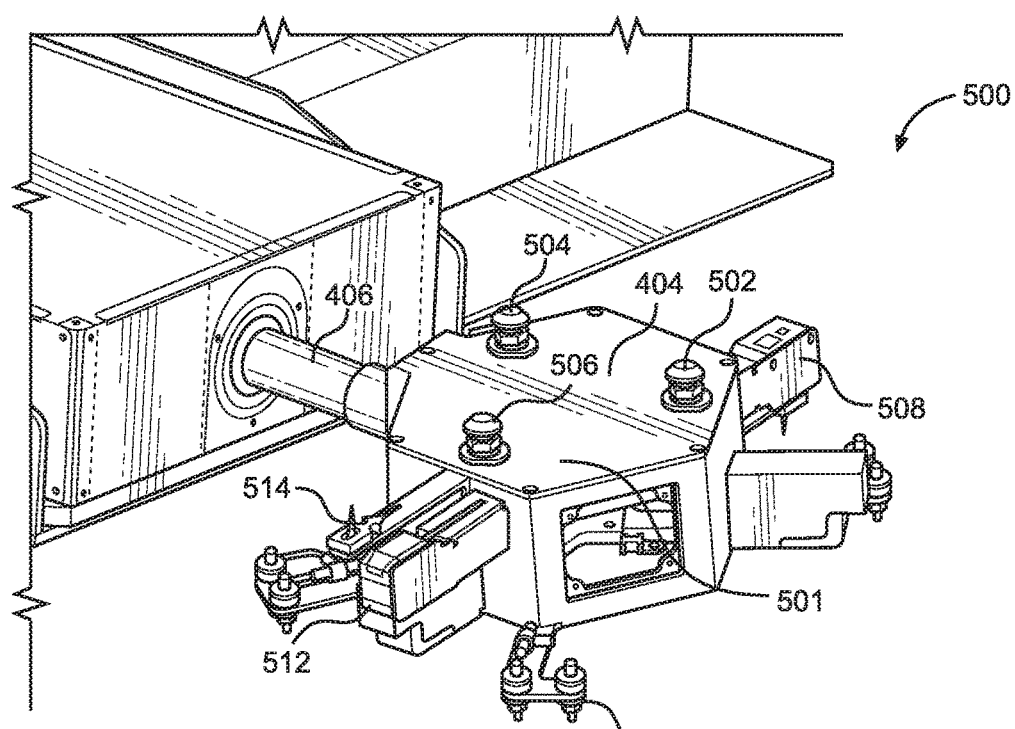
FIG. 5 is a schematic diagram depicting a view of an embodiment of a robotic end effector with a first surface facing upwards.

FIG. 5 is a schematic diagram depicting a view 500 of an embodiment of robotic end effector 404 with a first surface 501 facing upwards. In an aspect, first surface 501 includes a plurality of suction cups—a suction cup 502, a suction cup 504, and a suction cup 506. In some embodiments, suction cup 502 through 506 are configured to collectively grasp a silicon wafer by vacuum adhesion. In an aspect, a combination of first surface 501 and suction cup 502 through 506 are referred to as a "wafer handler portion" of robotic end effector 404 (or robotic actuator 400). This combination is also referred to as a "wafer handler."

In an aspect, robotic actuator includes an axial actuator 406 that is configured to rotate robotic actuator about a flip axis that is substantially coaxial with an axis associated with axial actuator 406. Such a rotation may be performed such that first surface 501 faces downwards, enabling robotic actuator 400 to move robotic end effector 404 in a vertical direction along Z-track 408. Using this vertical motion, robotic end effector 404 may vertically descend to grasp a silicon wafer using a combination of suction cup 502 through 506. When first surface 501 faces downwards, suction cup 502 through 506 are enabled to engage and grasp a silicon wafer using vacuum forces.

View 500 also depicts a suction cup 510 that is configured to grasp a ring in collaboration with other similar suction cups, as described herein. In an aspect, robotic end effector 404 includes a sensor 508, a sensor 512, and a sensor 514. In an aspect, each of sensor 508 and 512 is configured to detect a difference between a silicon wafer and a ring, and determine if a correct object (i.e., a silicon wafer or a ring) is about to be grasped. In some embodiments, each of sensor 508 and 512 is referred to as a "wafer-ring check sensor." Sensor 514 is configured to detect a presence of a ring and/or second silicon wafer adhering to a first silicon when an intent of robotic end effector 404 is to grasp only the first silicon wafer. In some embodiments, sensor 514 may be referred to as a "ring stick sensor." Sensors 508, 512 and 514 may be any combination of optical sensors, mechanical (thickness) sensors, and so on.

Figure 6:
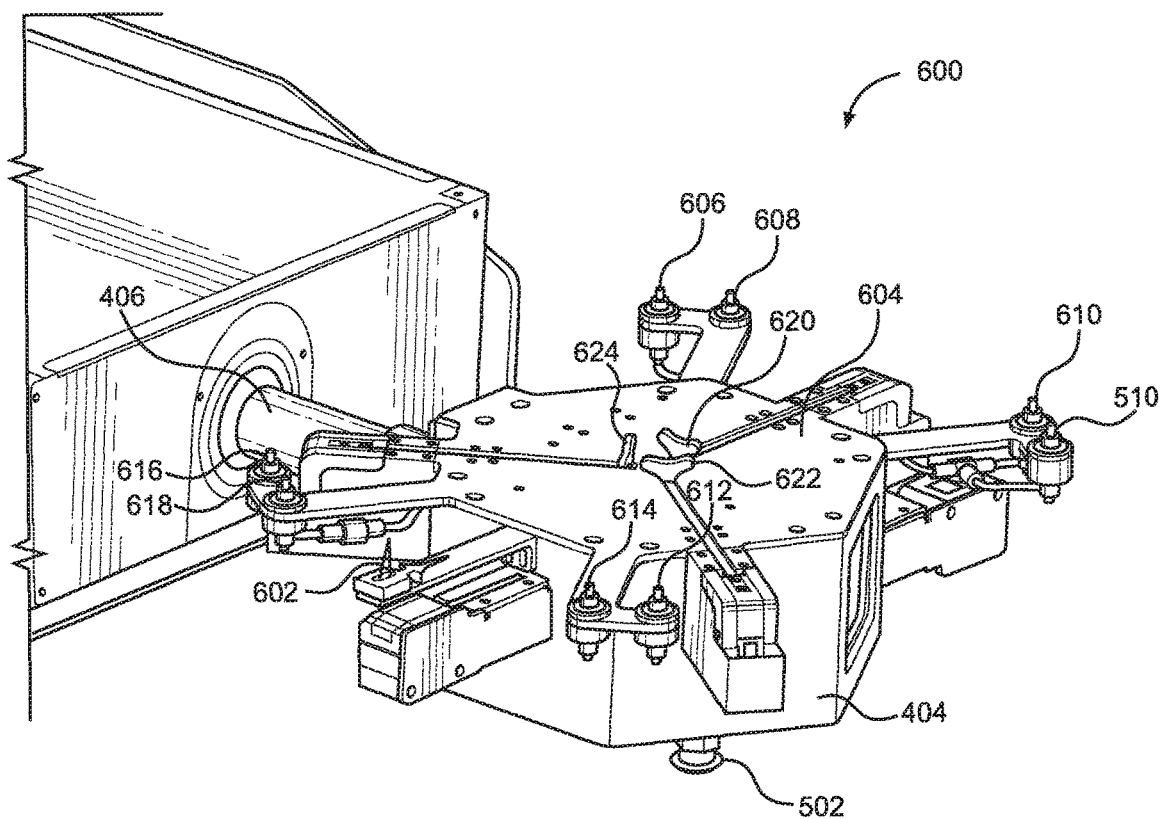
FIG. 6 is a schematic diagram depicting a view of an embodiment of a robotic end effector with a second surface facing upwards.

FIG. 6 is a schematic diagram depicting a view 600 of an embodiment of robotic end effector 404 with a second surface 604 facing upwards. In an aspect, robotic actuator 404 may be rotated from the spatial orientation presented in view 500 (i.e., with first surface 501 facing upwards) to the spatial orientation presented in view 600 (i.e., with second surface 604 facing upwards) by axial actuator 406 rotating robotic end effector 404 about the flip axis.

View 600 depicts suction cup 502 depicted in view 500. In view 600, suction cup 502 is shown facing downwards. In an aspect, suction cup 510 along with a suction cup 606, a suction cup 608, a suction cup 610, a suction cup 612, a suction cup 614, a suction cup 616 and a suction cup 618 are configured to collectively grasp a ring using vacuum forces.

In an aspect, grasping a ring is accomplished by axial actuator 406 rotating robotic end effector 404 about the flip axis such that second surface 604 faces downwards—this spatial orientation is depicted by view 500. The spatial orientation depicted in view 500 enables robotic actuator 400 to move robotic end effector 404 in a vertical direction along Z-track 408. Using this vertical motion, robotic end effector 404 may vertically descend to grasp a ring using a combination of suction cup 510, and suction cup 606 through 618. When second surface 604 faces downwards, suction cup 510, and suction cup 606 through 618 are enabled to engage and grasp a ring using vacuum forces. Similarly, view 600 as depicted may be a spatial orientation used to grasp a silicon wafer.

In an aspect, robotic end effector 404 includes a sensor 602 that is configured to detect a presence of a second silicon wafer and/or a ring adhering to a first silicon wafer when an intent of robotic end effector is to grasp only the first silicon wafer. Sensor 602 may be any of an optical sensor, a mechanical (thickness) sensor, and so on. In some embodiments, sensor 602 may also be referred to as a "ring presence sensor."

In some embodiments, robotic end effector 404 includes an appendage 620, an appendage 622, and an appendage 624. Collectively, appendage 620 through 624 function as a bulk grabber that is configured to grasp a stack of rings. View 600 depicts appendage 620 through 624 in a retracted state; appendage 620 through 624 may be extended (i.e., deployed) to perform any functions associated with the bulk grabber, as described herein.

In an aspect, a combination of second surface 604, suction cup 510 and 606 through 618, and the bulk grabber is referred to as a "ring handler portion" of robotic end effector 404 (or robotic actuator 400). This combination, also referred to as a "ring handler," is configured to manipulate one or more rings associated with HWP sorter 100.

Figure 7:
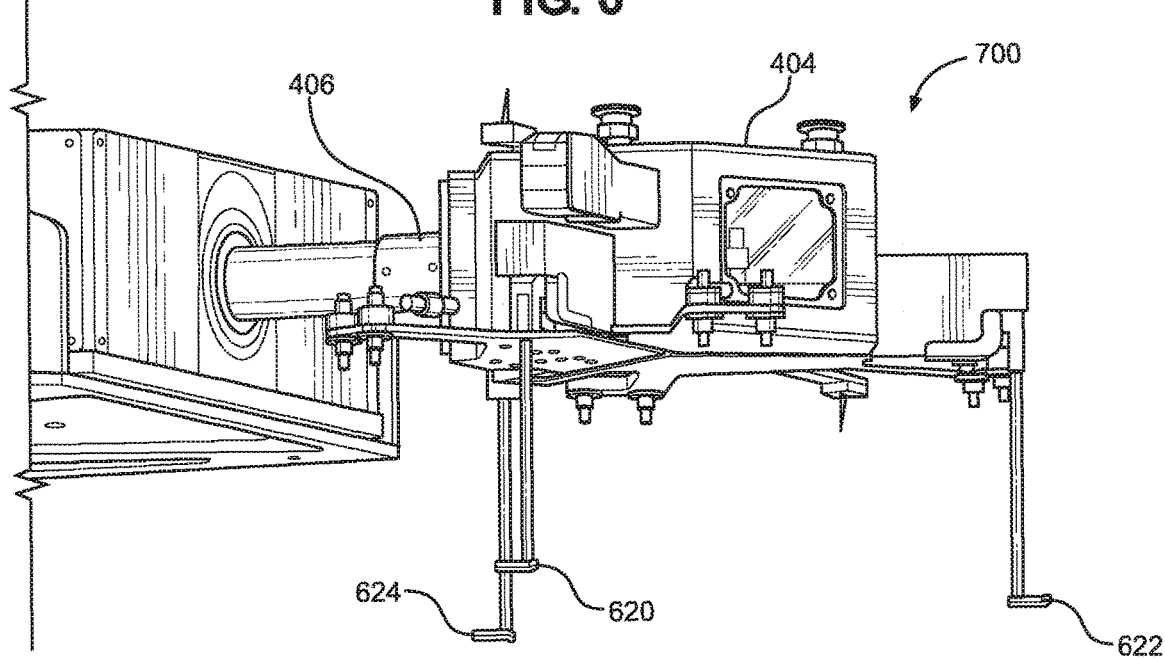
FIG. 7 is a schematic diagram depicting a view of an embodiment of a robotic end effector with multiple bulk grabber appendages deployed.

FIG. 7 is a schematic diagram depicting a view 700 of an embodiment of robotic end effector 404 with multiple bulk grabber appendages deployed. View 700 depicts each of appendage 620 through 624 in an extended (i.e., deployed) state. In this deployed state, appendage 620 through 624 are enabled to grasp a stack of rings while functioning as a bulk grabber. In some embodiments, appendage 620 through 624 may be deployed and retracted using pneumatic actuation. In other embodiments, other actuation or retraction methods such as magnetic, electric (e.g., using electric motors), mechanical (e.g., using springs), or any combination of actuation or retraction methods may be used to deploy or retract appendage 620 through 624. View 700 also depicts axial actuator 406 that rotates robotic end effector 404 about the flip axis, enabling robotic end effector 404 to change a mode of operation from ring handler to wafer handler or vice versa.

Figure 8:
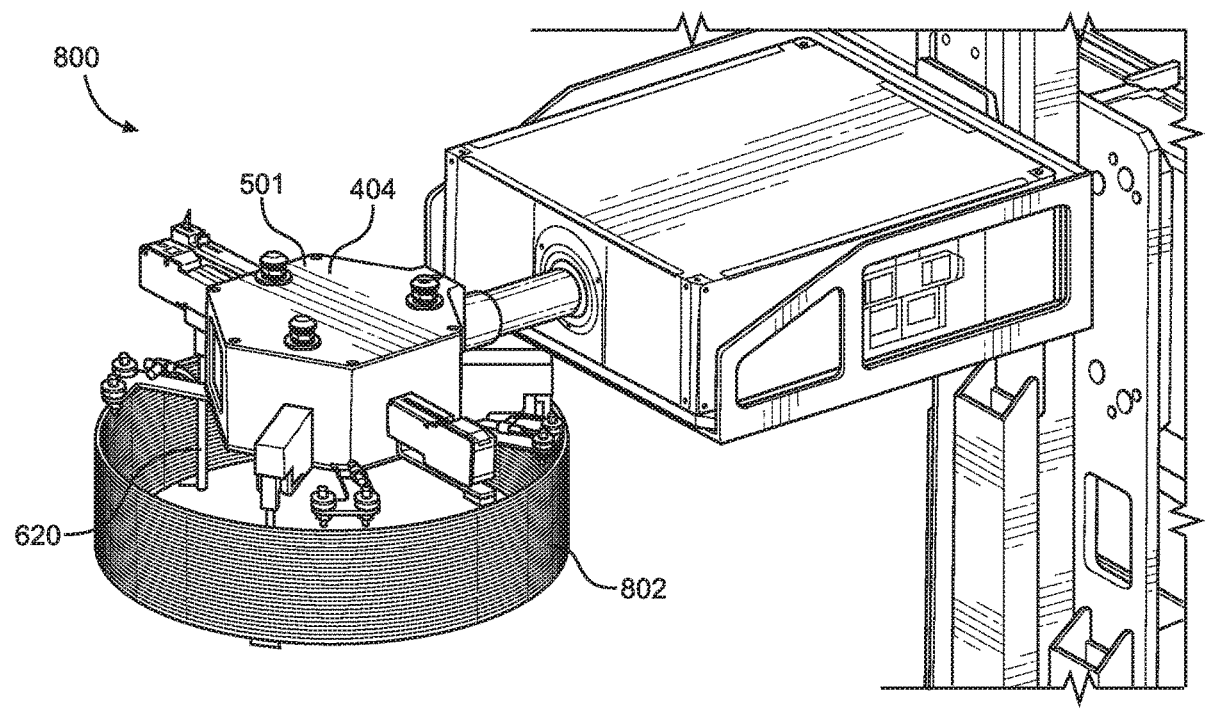
FIG. 8 is a schematic diagram depicting a view of an embodiment of a robotic end effector grasping multiple rings.

FIG. 8 is a schematic diagram depicting a view 800 of an embodiment of a robotic end effector 404 grasping multiple rings. View 800 shows robotic end effector 404 functioning as a bulk grabber, with first surface 501 facing upwards. In this mode of operation, appendages 620 through 624 are fully deployed—view 700 depicts appendage 620 in full view. In this mode, robotic actuator 404 is shown grasping a stack of rings 802 in bulk grabber mode.

In order to grasp a stack of rings, robotic end effector 404 descends, for example, via Z-track 408, in a proximity of the stack of rings. At this time, appendages 620 through 624 are retracted. When robotic end effector 404 is at a predetermined height above the stack of rings, appendages 620 through 624 are actuated and extended such that a projection on a distal end of each of appendage 620 through 624 engages a bottom surface of the lowest ring in the stack of rings. In some embodiments, the predetermined height is approximately 90-100 mm above a surface on which the stack of rings is resting.

Once each of appendage 620 through 624 has engaged the bottom surface of the lowest ring, robotic end effector 404 moves upwards along Z-track 408. Robotic end effector 404 lifts the stack of rings, thus completing the bulk grab operation. Robotic actuator 400 can now move robotic end effector along any combination of X-track 402 and Z-track 408 to transport the stack of rings to an intended destination.

Figure 9:
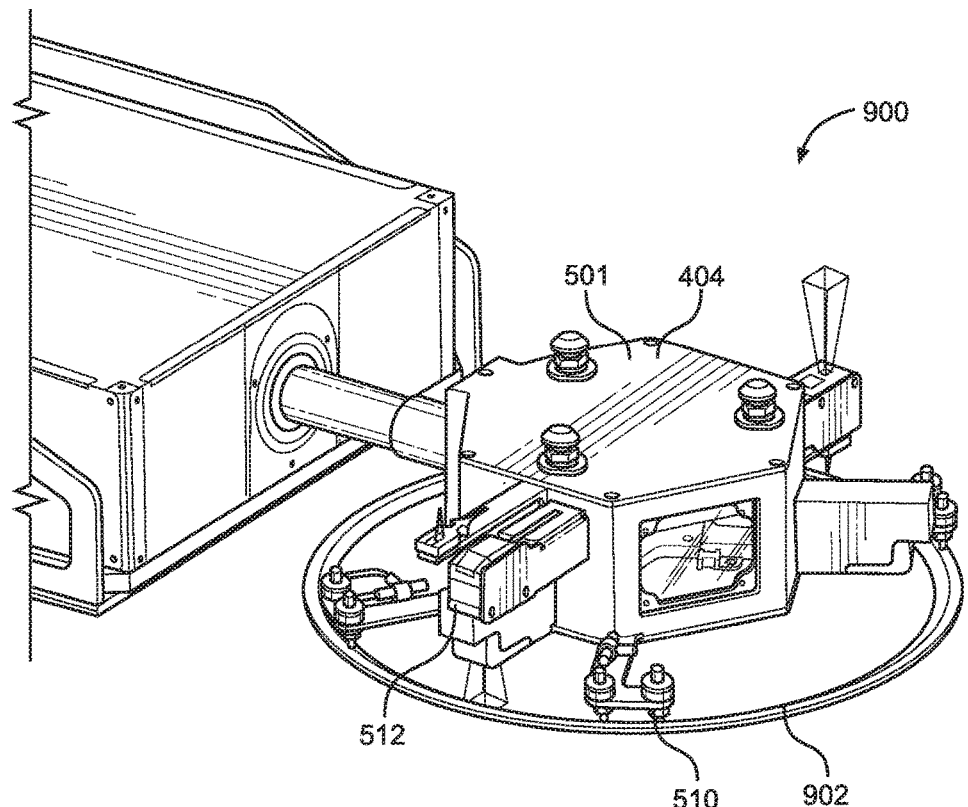
FIG. 9 is a schematic diagram depicting a view of an embodiment of a robotic end effector grasping a single ring.

FIG. 9 is a schematic diagram depicting a view 900 of an embodiment of a robotic end effector 404 grasping a single ring. In view 900, robotic end effector 404 functions as a ring handler (first surface 501 facing upwards), and grasps a ring 902 using suction cups such as suction cup 510. Sensor 512 is configured to detect whether an object to be grasped is a wafer or a ring, when the intent is to pick up a ring.

Figure 10:
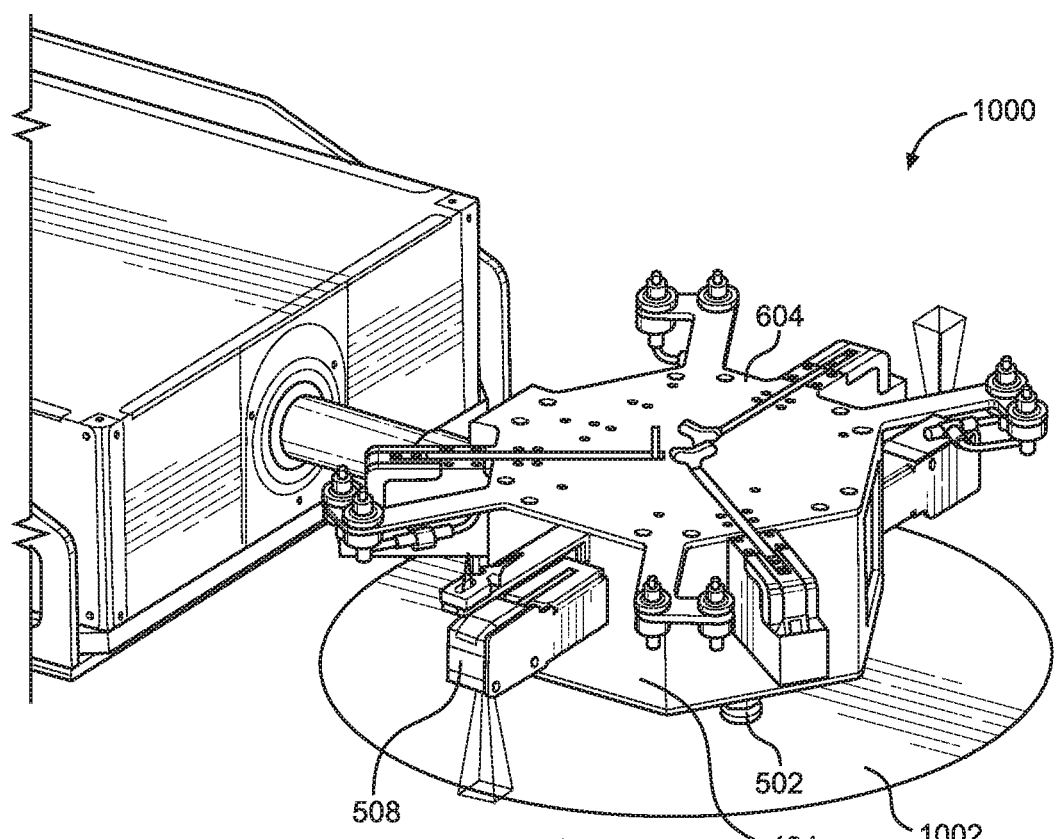
FIG. 10 is a schematic diagram depicting a view of an embodiment of a robotic end effector grasping a silicon wafer.

FIG. 10 is a schematic diagram depicting a view 1000 of an embodiment of a robotic end effector 404 grasping a silicon wafer 1002. In view 1000, robotic end effector 404 functions as a wafer handler (second surface 604 facing upwards), and grasps silicon wafer 1002 using suction cups such as suction cup 502. Sensor 508 is configured to detect if a topmost object in the stack is a ring or a wafer, when an intent of robotic end effector 404 is to grasp only silicon wafer 1002. In an aspect, sensor 508 functions as a detection sensor.

Figure 11:
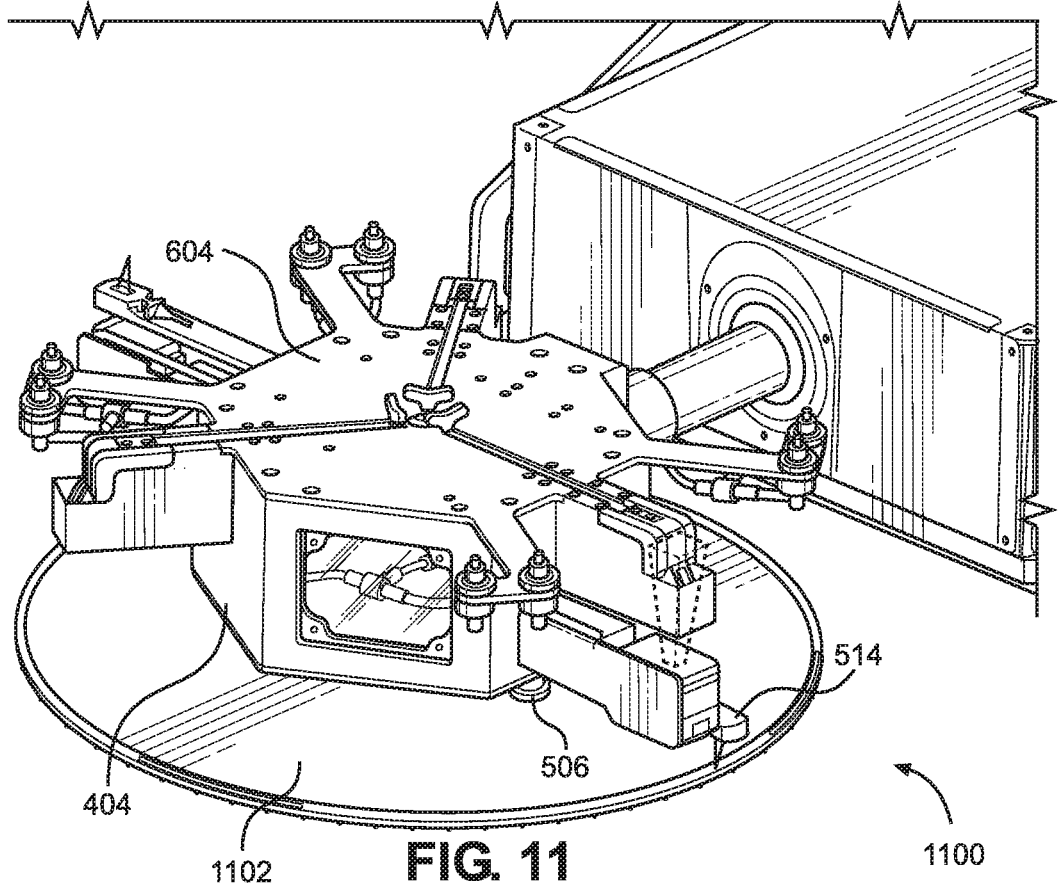
FIG. 11 is a schematic diagram depicting a view of an embodiment of a robotic end effector grasping two silicon wafers and a ring.

FIG. 11 is a schematic diagram depicting a view 1100 of an embodiment of robotic end effector 404 grasping two silicon wafers and a ring. In view 1100, robotic end effector 404 functions in wafer handler mode, with second surface 604 facing upwards. An intent of robotic end effector is to grasp a single silicon wafer using suction cups, including suction cup 506 as shown in view 1100. Instead, a combination stack 1102 comprising a silicon wafer, a ring, and a silicon wafer is grasped by robotic end effector 404. This may be a result of the two silicon wafers adhering to the ring due to, for example, vacuum forces. Thickness sensor 514 is configured to detect if more than one silicon wafer and one or more rings are grasped by robotic end effector 404. In this case, a warning may be issued by HWP sorter 100 to an operator of the system. In an aspect, thickness sensor 515 may be referred to as a "ring stick sensor." Sensing two silicon wafers adhering to a ring as depicted in view 1100 enables HWP sorter 100 to avoid a possibility of the lower silicon wafer in combination stack 1102 from falling and breaking.

Figure 12:
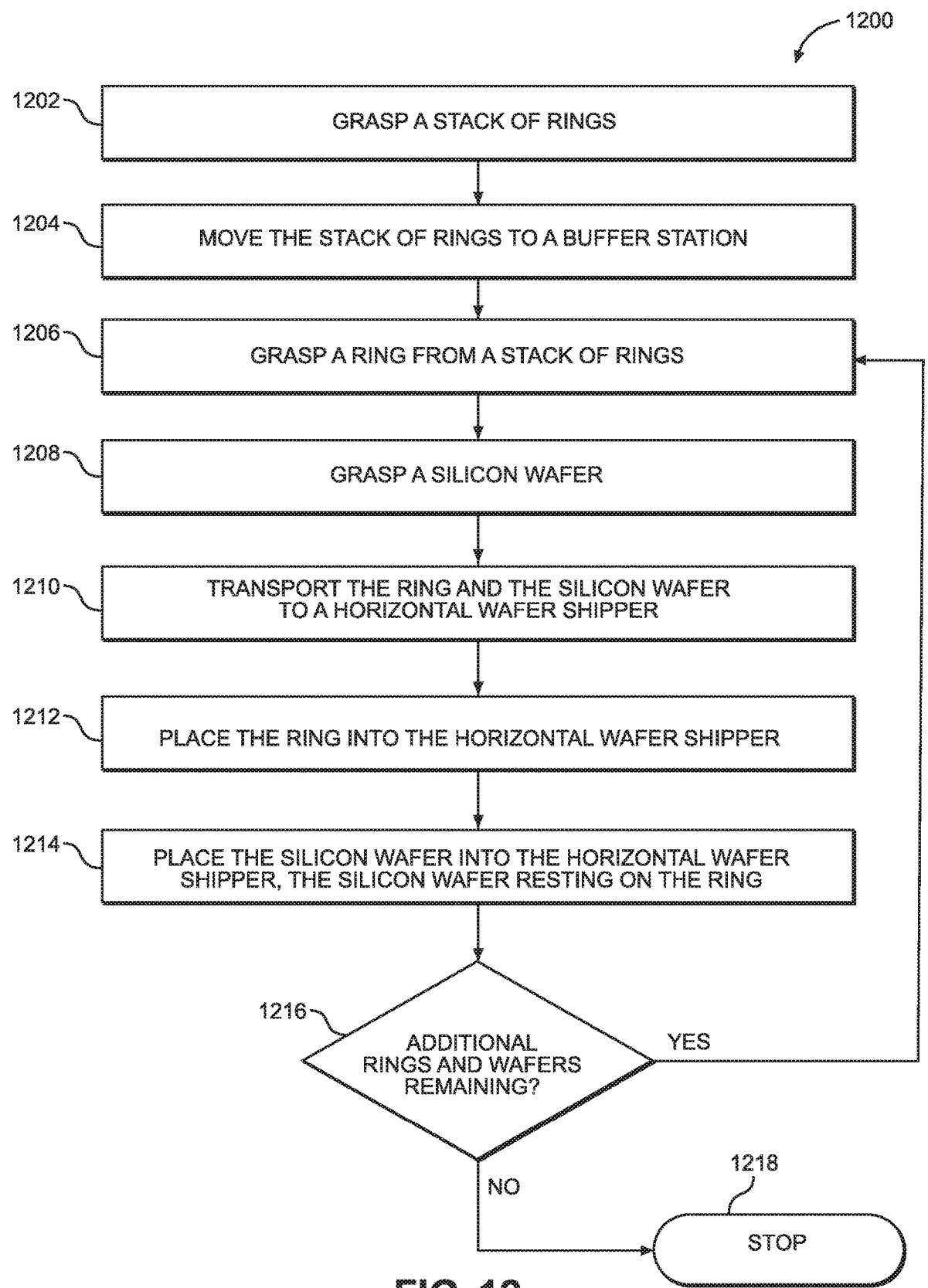
FIG. 12 is a flow diagram depicting an example method to create a stack of silicon wafers and rings by a robotic actuator.

FIG. 12 is a flow diagram depicting an example method 1200 to create a stack of silicon wafers and rings by a robotic actuator. Method 1200 includes grasping a stack of rings (1202). In an aspect, robotic end effector 404 operating as a ring handler in bulk grabber mode may be moved by robotic actuator 400 to an HWS carrier containing a stack of rings. In an aspect, the stack of rings may include 26 rings, with no silicon wafers. Robotic end effector 404 grasps the entire stack of rings in bulk grabber mode.

Method 1200 includes moving (i.e., transporting) the stack of rings to a buffer station (1204). In an aspect, the stack of rings grasped by robotic end effector 404 may be transported to the buffer station by robotic actuator 400. The stack of rings is deposited at the buffer station by robotic end effector 404.

Method 1200 includes grasping a ring from the stack of rings (1206). In an aspect, robotic end effector 404 may be configured as a ring handler (i.e., second surface 604 facing downwards), and may grasp a ring from the stack of rings at the buffer station using suction cup 510 and 606 through 618.

Method 1200 includes grasping a silicon wafer (1208). In an aspect, robotic end effector 404 is configured as a wafer handler, and grasps a silicon wafer that has been delivered to robotic end effector 404 by wafer handler robot 124 from 300 mm aligner 104 or a FOUP. To accomplish this, robotic end effector 404 moves to a designated position in an associated XZ plane. A silicon wafer is placed on a wafer handler side of robotic end effector 404 (i.e., a side of robotic end effector 404 associated with surface 501) by wafer handler robot 124. Robotic end effector 404 grasps the silicon wafer using a combination of suction cup 502, 504 and 506.

Method 1200 includes transporting the ring and the silicon wafer to a horizontal wafer shipper (HWS) (1210). In an aspect, robotic actuator 400 moves robotic end effector 404, along X-stage 402, to the HWS.

Method 1200 includes placing the ring into the HWS (1212). In an aspect, robotic actuator 400 moves robotic end effector downwards along Z-stage 408, towards the HWS. Axial actuator 406 may rotate robotic end effector about the flip axis if necessary such that second surface 604 and the grasped ring are facing downwards. Robotic end effector 404 then deposits (i.e., places) the ring into the HWS.

Method 1200 includes placing the silicon wafer into the HWS, with the silicon wafer resting on the ring (1214). In an aspect, after placing the ring into the HWS at stage 1212, robotic end effector 404 is rotated by axial actuator 406 about the flip axis, so that first surface 501 and the grasped silicon wafer are facing downwards. Robotic actuator 404 then places the silicon wafer into the HWS, such that the silicon wafer rests on the ring.

Method 1200 includes checking to determine whether any additional rings and wafers (e.g., ring-wafer pairs) are remaining (1216). If additional rings and wafers are remaining, then method 1200 returns to 1206. In this return process, robotic actuator 400 may move robotic end effector 404 along X-stage 402, back to the buffer station. Also, axial actuator 406 may rotate robotic actuator 404 about the flip axis so that second surface 604 is facing downwards. If no additional rings and wafers are remaining at 1216, method 1200 goes to 1218, where the method ends.

Figure 13:
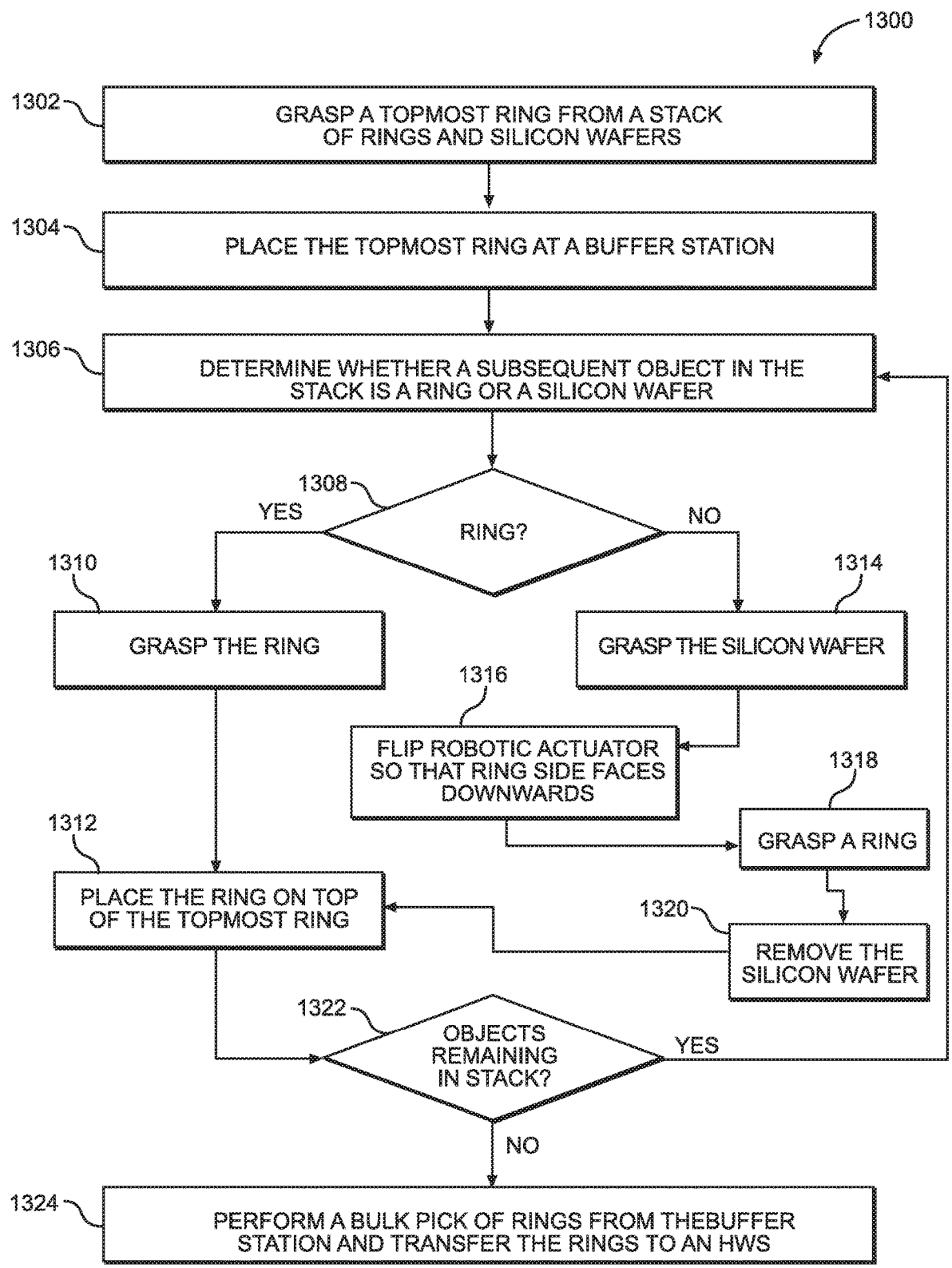
FIG. 13 is a flow diagram depicting an example method to unpack a stack of rings and silicon wafers by a robotic actuator.

FIG. 13 is a flow diagram depicting an example method 1300 to unpack a stack of rings and silicon wafers by robotic actuator 400. In an aspect, the stack of rings and silicon wafers is comprised of 26 rings alternately stacked with zero or more silicon wafers.

Method 1300 includes grasping a topmost ring from the stack of rings and silicon wafers (1302). To accomplish this, robotic actuator 400 may move robotic end effector 404 along X-stage 402, till robotic end effector 404 is over an HWS carrier containing the stack of rings and silicon wafers. The robotic end effector 404 is in ring handler mode, with second surface 604 facing downwards. Robotic end effector 404 then grasps the topmost ring from the stack of rings and silicon wafers using suction cup 510 and 606 through 618.

Method 1300 includes placing the topmost ring at a buffer station (1304). In an aspect, robotic actuator 400 moves robotic end effector 404 towards the buffer station. Robotic end effector 404 deposits the ring at the buffer station.

Method 1300 includes determining whether a subsequent object in the stack is a ring or a silicon wafer (1306). In order to accomplish this, axial actuator 406 rotates robotic end effector 404 about the flip axis so that first surface 501 faces downwards. Robotic actuator 400 then moves robotic end effector 404 to a position above the HWS. Next, robotic actuator 400 moves robotic end effector 404 into a proximity of the subsequent object, and robotic end effector uses a detection sensor such as sensor 508 to determine whether the subsequent object is a ring or a silicon wafer.

Method 1300 includes confirming whether the subsequent object is a ring (1308). If the object is a ring, then method goes to 1310, which includes grasping the ring. To accomplish this, robotic actuator 400 moves robotic end effector 404 out of the HWS, and axial actuator 406 rotates robotic end effector about the flip axis so that second surface 604 faces downwards. Robotic actuator 400 then moves robotic end effector 404 into the HWS, where the ring is grasped. The method then goes to 1312, where robotic actuator 400 moves robotic end effector 404 to place the ring on top of the topmost ring at the buffer station. The deposited ring now becomes the topmost ring.

If, at 1308, it is determined that the subsequent object is not a ring, then robotic end effector 404 grasps the associated silicon wafer at 1314. In an aspect, axial actuator 406 may rotate robotic end effector 404 about the flip axis, so that second surface 604 is facing downwards (1316). Robotic end effector 404 then grasps a subsequent ring (1318) in the stack. Next, the silicon wafer is removed (1320). In an aspect, 1320 is accomplished by wafer handler robot 124 grasping the silicon wafer from robotic actuator 404 and depositing the silicon wafer at a FOUP. The method then goes to 1312.

1312 goes to 1322, where the method checks to determine whether there are any objects remaining in the stack of rings and silicon wafers. If there are any objects remaining, then the method returns to 1306. If there are no objects, remaining, then method 1300 goes to 1324, where robotic end 404 effector enters a bulk grabber mode, performs a bulk grab of the rings from the buffer station, and transfers the rings to an HWS.

Figure 14:
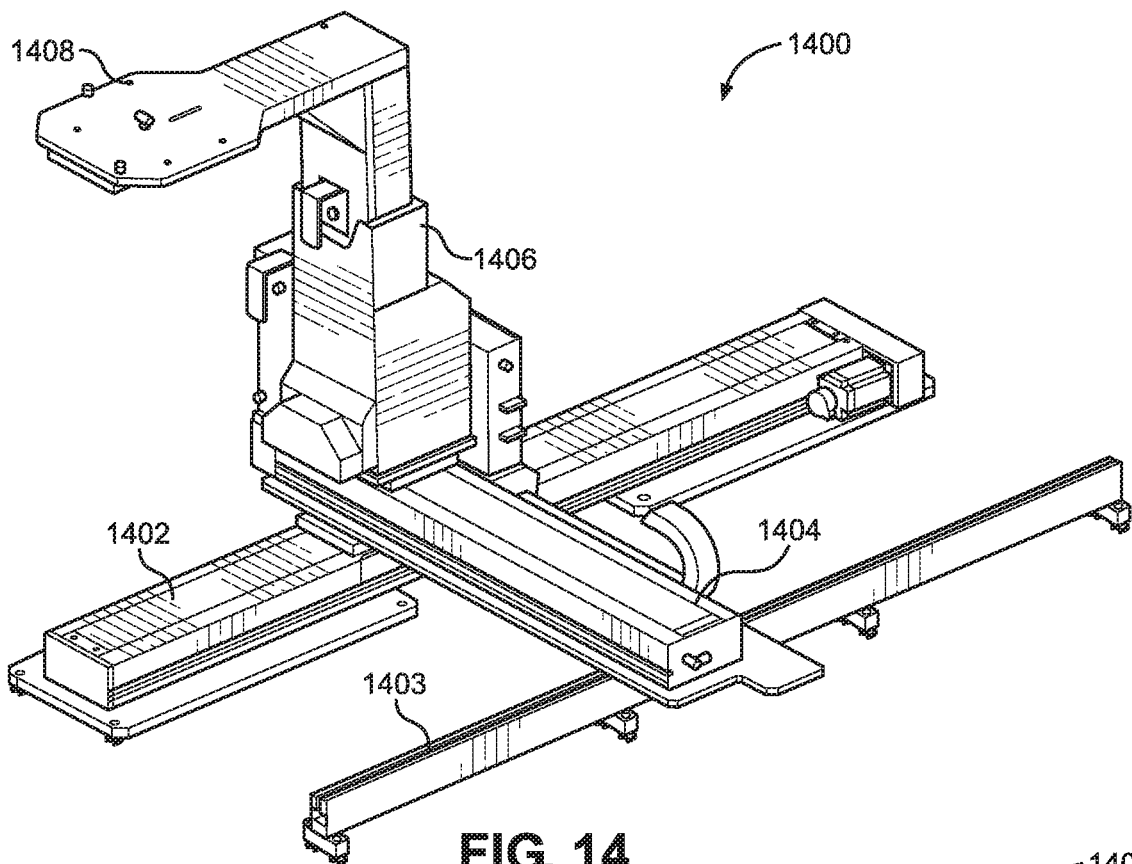
FIG. 14 is a schematic diagram depicting an embodiment of an HWS handler.

FIG. 14 is a schematic diagram depicting an embodiment of an HWS handler 1400. HWS handler 1400 may be similar to HWS handler 116. In an aspect, HWS handler 1400 is configured to hold, manipulate and transport an HWS containing a stack of alternating rings and silicon wafers. HWS handler 1400 may include a moving stage 1408 that is configured to hold and transport an HWS containing an alternating stack of silicon wafers and rings. In an embodiment, HWS handler 1400 may be configured to move moving stage 1408 in three dimensions along an X-track 1404, a first Y-track 1402, a second Y-track 1403, and a Z-track 1406.

Figure 15:
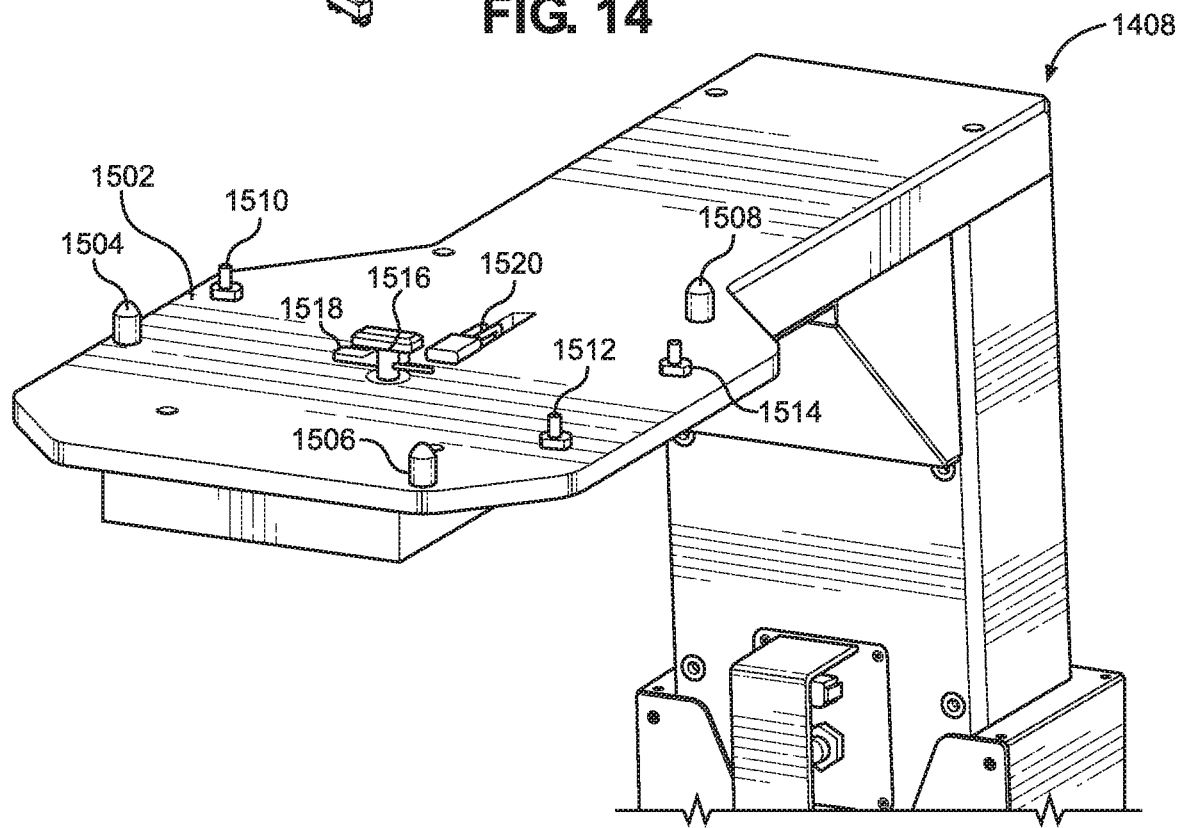
FIG. 15 is a schematic diagram depicting a close-up view of an embodiment of a moving stage.

FIG. 15 is a schematic diagram depicting a close-up view of an embodiment of a moving stage 1408. In some embodiments, moving stage 1408 a includes a platform 1502 on which an HWS is placed. A kinematic pin 1504, a kinematic pin 1506, and a kinematic pin 1508 collectively function to align an HWS on moving stage 1408. A placement sensor 1510, a placement sensor 1512, and a placement sensor 1514 determine a placement of an HWS, while a presence sensor 1520 determines a presence of an HWS on moving stage 1408. A mechanical hard stop 1518 is configured to assist in physically aligning an HWS placed on platform 1502. A pneumatic clamp 1516 is a clamp mechanism that is configured to rotate and simultaneously move in a downward direction to mechanically anchor the HWS to platform 1502. Once the HWS is anchored to platform 1502, HWS handler 1400 can move in three dimensions (i.e., in an XYZ space) without affecting or upsetting an associated placement of the HWS on platform 1502. Some features of HWS handler 1400 are provided below:

Picks up an HWS from a load port and brings it into a mini-environment for processing and consists of:

X, Y, and Z direction tracks to move the HWS between two load ports, a de-lidding station, and ring handler access station.

SEMI Standard kinematic pins for positioning the HWS on the stage.

A pneumatic clamp for holding the HWS on the stage.

Sensors for confirming the HWS is clamped and present.

Figure 16:
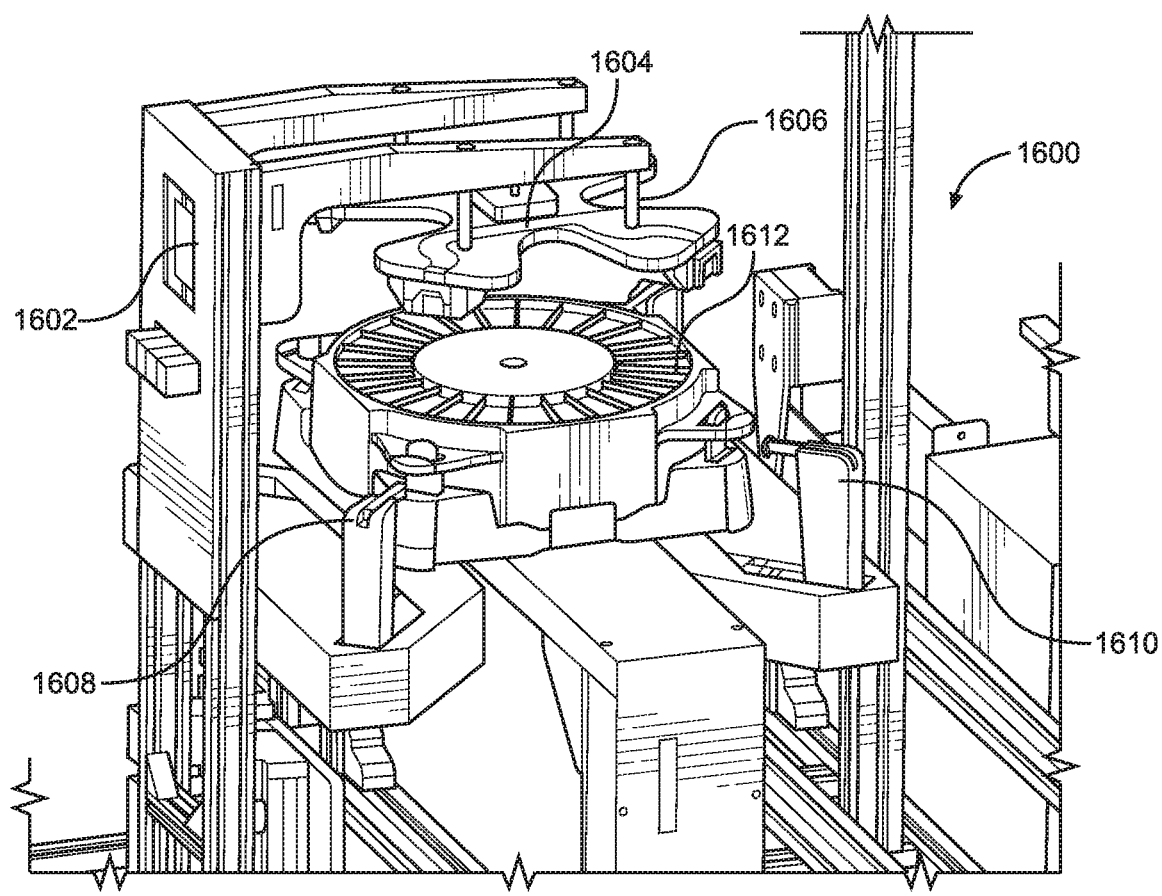
FIG. 16 is a schematic diagram depicting an embodiment of a lid removal station.

FIG. 16 is a schematic diagram depicting an embodiment of a lid removal station 1600 included in some embodiments of HWP sorter 100. In some embodiments, lid removal station 1600 may also be referred to as a "de-lidder" or a "delidder," and may be identical to delidder 120. In an aspect, lid removal station 1600 removes a lid associated with an HWS 1612. This lid removal process is performed by a lid chuck 1604 that includes a spring-loaded, floating mechanism 1606. Lid chuck 1604 may also include a vacuum cup.

In some aspects, lid chuck 1604 may be configured to move along a linear Z-axis 1602 (also referred to Z-track 1602). This motion enables lid chuck 1604 to position itself such that it is able to remove a lid off of HWS 1612. In an embodiment, lid removal station 1600 includes a pneumatic unlatch clamp 1608 and a pneumatic unlatch clamp 1610 that collectively facilitate a removal (i.e., an unlatching) of the lid of HWS 1612.

Figure 17:
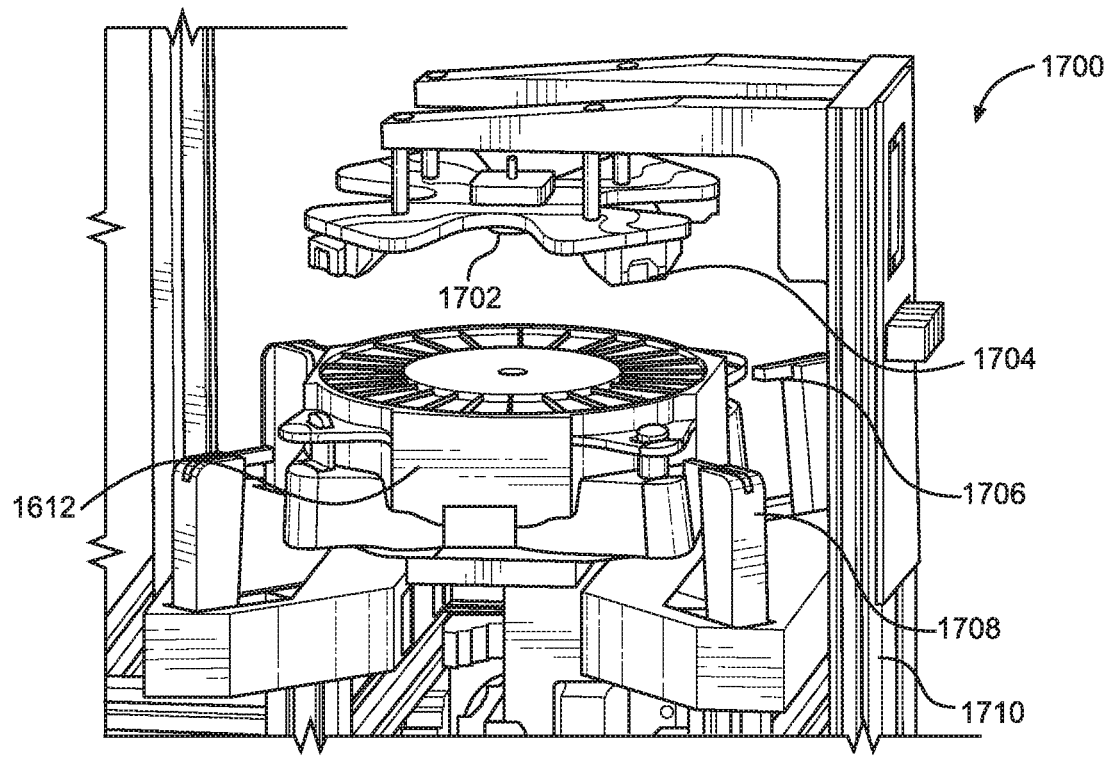
FIG. 17 is a schematic diagram depicting an embodiment of a lid removal station.

FIG. 17 is a schematic diagram depicting an embodiment of a lid removal station 1700. Lid removal station 1700 as depicted in FIG. 17 represents an alternate view of lid removal station 1600. In an aspect, lid removal station 1700 includes a lid chuck 1704 (also known as a de-lidding head) with an associated vacuum cup 1702 that is used to facilitate the lid removal process off of HWS 1612. In an aspect, lid removal station 1700 includes a pneumatic unlatch clamp 1706 and a pneumatic unlatch 1708 that help unlatch the lid off of HWS 1612. In some embodiments, a pneumatic latch is also referred to as a "pneumatic pusher." In an aspect, lid chuck 1704 is configured to move in a vertical direction along a Z-track 1710. This facilitates the delidding process. Some features of lid removal station 1600 and 1700 include:

Unlatching the HWS lid, removes it, and, in reverse, places the lid and latches it.

Includes a de-lidding head that uses a vacuum cup to chuck the lid.

Includes a Z-direction track that moves the lid and lid head up and down.

Includes pneumatic pushers that unlatch the lid.

Figure 18:
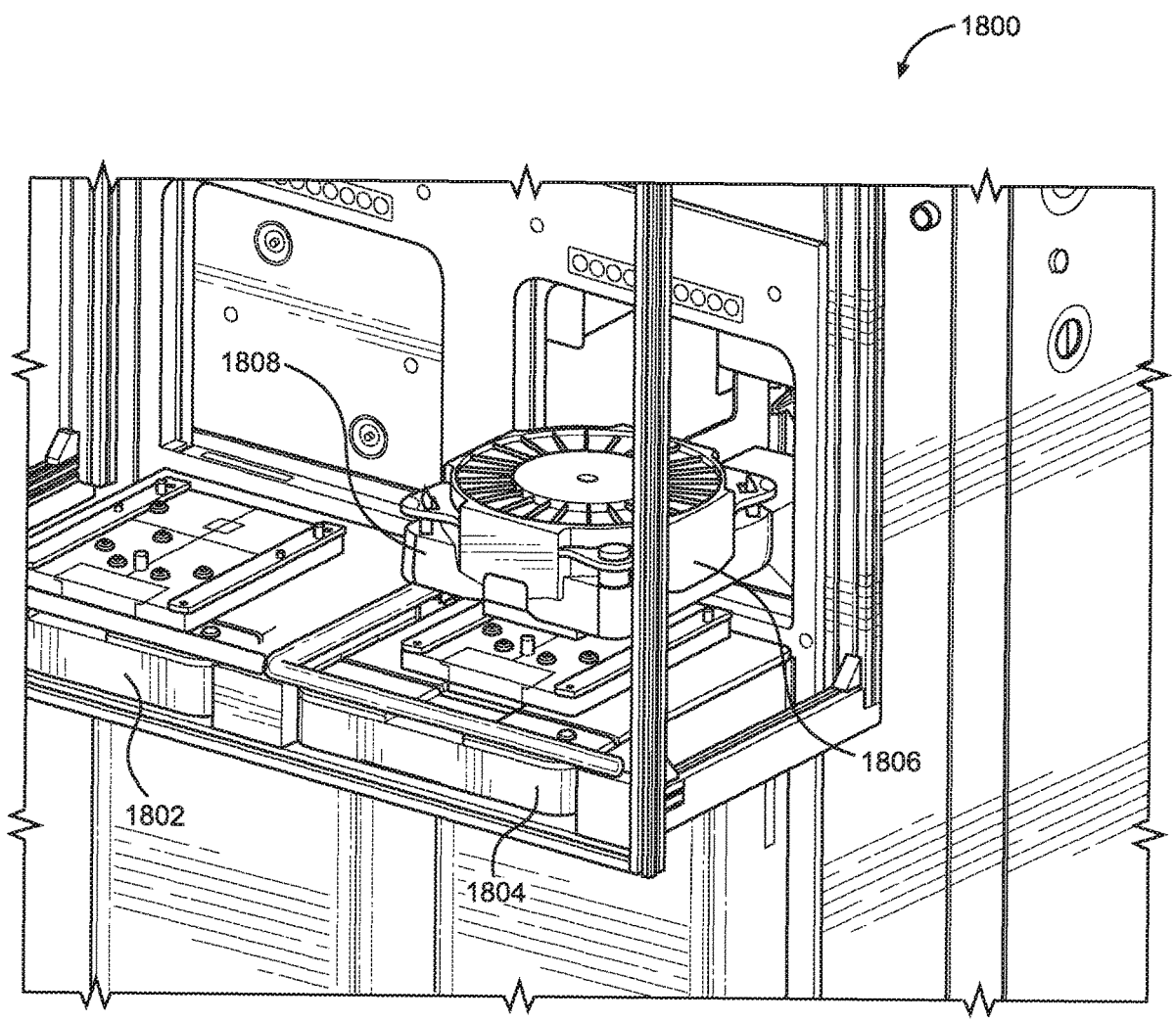
FIG. 18 is a schematic diagram depicting a view of an HWS at a load port.

FIG. 18 is a schematic diagram depicting a view 1800 of an HWS 1806 at a load port 1804. In an aspect, load port 1804 is associated with HWP sorter 100. View 1800 also depicts a load port 1802, and a moving stage 1808. View 1800 depicts how an HWS is received or deposited, to or from load port 1804 respectively.

Although the present disclosure is described in terms of certain example embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, without departing from the scope of the present disclosure.

The invention claimed is:

1. A robotic actuator comprising: a robotic end effector including: a first surface having multiple attached wafer suction cups arranged to collectively grasp a silicon wafer; and a second surface including: multiple attached ring suction cups arranged to collectively grasp a ring; and a bulk grabber positionable to grasp a collective stack of rings; and an axial actuator configured to rotate the robotic end effector about a flip axis, such that either the first surface or the second surface faces vertically upwards.

2. The robotic actuator of claim 1 further comprising a detection sensor enabled to distinguish between a grasped silicon wafer and a grasped ring.

3. The robotic actuator of claim 1 further comprising a ring-wafer grasping sensor enabled to detect a silicon wafer grasped along with a ring.

4. The robotic actuator of claim 1 further comprising a wafer grasping sensor enabled to detect multiple silicon wafers grasped at the same time.

5. The apparatus of claim 4, wherein the wafer grasping sensor is a thickness sensor.

6. The apparatus of claim 1, wherein the bulk grabber is pneumatically actuated.

7. The apparatus of claim 1, wherein the bulk grabber is enabled to grasp a stack of 26 rings.

8. The apparatus of claim 1, wherein the silicon wafer has a diameter of approximately 300 mm.

9. A method to create a stack of silicon wafers and rings by a robotic actuator, the method comprising:
grasping a first ring from a stack of rings;
grasping a first silicon wafer;
transporting the first ring and the first silicon wafer to a horizontal wafer shipper;
placing the first ring into the horizontal wafer shipper;
placing the first silicon wafer into the horizontal wafer shipper such that the first silicon wafer rests on the first ring;
grasping a second ring from the stack of rings;
grasping a second silicon wafer;
transporting the second ring and the second silicon wafer to the horizontal wafer shipper;
placing the second ring into the horizontal wafer shipper; and
placing the second silicon wafer into the horizontal wafer shipper such that the second silicon wafer rests on the second ring.

10. The method of claim 9, wherein the stack of rings is comprised of 26 rings.

11. The method of claim 9, wherein the first ring is grasped using one or more suction cups.

12. The method of claim 9, wherein the action of grasping the first ring is performed by a ring handler portion of the robotic actuator.

13. The method of claim 9, wherein the action of grasping the first silicon wafer is performed by a wafer handler portion of the robotic actuator.

14. The method of claim 9, wherein the first silicon wafer and the second silicon wafer each have a diameter of 300 mm.

15. The method of claim 9, further comprising transitioning between grasping the first ring and the first silicon wafer, the transitioning further comprising a robotic end effector associated with the robotic actuator performing a rotation about a flip axis.

16. A method to unpack a stack of silicon wafers and rings by a robotic actuator, the method comprising:
grasping a topmost ring from the stack;
placing the topmost ring at a buffer station;
determining whether a subsequent object in the stack is a silicon wafer or a ring;
responsive to determining that the subsequent object is a ring:
grasping the ring; and
placing the ring at the buffer station on top of the topmost ring; and
responsive to determining that the subsequent object is a silicon wafer:
grasping the silicon wafer; and
depositing the silicon wafer at a FOUP.

17. The method of claim 16, wherein the topmost ring is grasped using one or more suction cups.

18. The method of claim 16, wherein the silicon wafer is grasped using one or more suction cups.

19. The method of claim 16, wherein the action of grasping the topmost ring is performed by a ring handler portion of the robotic actuator.

20. The method of claim 16, wherein the action of grasping the silicon wafer is performed by a wafer handler portion of the robotic actuator.

\* \* \* \* \*